(12) United States Patent
Nomiyama et al.

(10) Patent No.: US 12,264,274 B2
(45) Date of Patent: Apr. 1, 2025

(54) BETA-SIALON PHOSPHOR AND LIGHT EMITTING DEVICE

(71) Applicant: DENKA COMPANY LIMITED, Tokyo (JP)

(72) Inventors: Tomohiro Nomiyama, Tokyo (JP); Manabu Kobayashi, Tokyo (JP); Masaru Miyazaki, Tokyo (JP); Tatsuya Okuzono, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 491 days.

(21) Appl. No.: 17/636,264

(22) PCT Filed: Aug. 14, 2020

(86) PCT No.: PCT/JP2020/030893
§ 371 (c)(1),
(2) Date: Feb. 17, 2022

(87) PCT Pub. No.: WO2021/033646
PCT Pub. Date: Feb. 25, 2021

(65) Prior Publication Data
US 2022/0298415 A1    Sep. 22, 2022

(30) Foreign Application Priority Data
Aug. 20, 2019  (JP) ................. 2019-150289

(51) Int. Cl.
*C09K 11/77*    (2006.01)
*C01B 21/082*    (2006.01)
(Continued)

(52) U.S. Cl.
CPC .... *C09K 11/77348* (2021.01); *C01B 21/0826* (2013.01); *C09K 11/617* (2013.01);
(Continued)

(58) Field of Classification Search
CPC ............ C09K 11/77348; C09K 11/617; C09K 11/7734; C09K 11/0883; C01B 21/0826;
(Continued)

(56) References Cited

U.S. PATENT DOCUMENTS 8,125,139 B2    2/2012  Emoto et al.
9,139,769 B2    9/2015  Emoto et al.
(Continued)

FOREIGN PATENT DOCUMENTS

CN    101128564 A    2/2008
CN    102770506 A    11/2012
(Continued)

OTHER PUBLICATIONS

Sep. 7, 2023 Office Action and Search Report Issued in Taiwanese Patent Application No. 109128036.
(Continued)

*Primary Examiner* — Karen Kusumakar
*Assistant Examiner* — Shawn Shaw Muslim
(74) *Attorney, Agent, or Firm* — Oliff PLC

(57) ABSTRACT

A europium-doped β-sialon phosphor, in which, when the ratio of an aluminum element at a depth of 8 nm from the surface of the phosphor, which is obtained by X-ray photoelectron spectroscopy, is indicated by $P_8$ [at %], and the ratio of an aluminum element at a depth of 80 nm from the surface of the phosphor is indicated by $P_{80}$ [at %], $P_8/P_{80} \leq 0.9$ is satisfied. A light emitting device containing this β-sialon phosphor.

8 Claims, 1 Drawing Sheet

(51) Int. Cl.
*C09K 11/61* (2006.01)
*H01L 33/50* (2010.01)
*H01L 23/00* (2006.01)

(52) U.S. Cl.
CPC .......... *H01L 33/502* (2013.01); *H01L 33/504* (2013.01); *C01P 2002/54* (2013.01); *C01P 2002/74* (2013.01); *C01P 2004/61* (2013.01); *H01L 24/48* (2013.01); *H01L 2224/48175* (2013.01)

(58) Field of Classification Search
CPC ..... H01L 33/502; H01L 33/504; H01L 24/48; H01L 2224/48175; H01L 33/50; C01P 2002/54; C01P 2002/74; C01P 2004/61; Y02B 20/00; G01N 23/2273
See application file for complete search history.

(56) References Cited

U.S. PATENT DOCUMENTS

| | | | |
|---|---|---|---|
| 10,093,855 | B2 | 10/2018 | Aoyagi et al. |
| 10,190,044 | B2 | 1/2019 | Hosokawa et al. |
| 10,266,768 | B2 | 4/2019 | Emoto et al. |
| 10,385,267 | B2 | 8/2019 | Morikawa et al. |
| 10,894,917 | B2 | 1/2021 | Aoyagi et al. |
| 11,512,250 | B2 | 11/2022 | Aoyagi et al. |
| 2009/0021141 | A1 | 1/2009 | Emoto et al. |
| 2012/0228551 | A1 | 9/2012 | Emoto et al. |
| 2012/0305844 | A1 | 12/2012 | Emoto et al. |
| 2012/0313507 | A1* | 12/2012 | Hashimoto ....... C04B 35/62685 423/325 |
| 2013/0300014 | A1 | 11/2013 | Emoto |
| 2016/0355731 | A1 | 12/2016 | Aoyagi et al. |
| 2017/0037311 | A1 | 2/2017 | Hosokawa et al. |
| 2017/0166810 | A1 | 6/2017 | Morikawa et al. |
| 2017/0342321 | A1 | 11/2017 | Aoyagi et al. |
| 2018/0002601 | A1* | 1/2018 | Emoto ............. C09K 11/77348 |
| 2019/0301709 | A1* | 10/2019 | Chen ....................... C09K 11/02 |
| 2019/0330528 | A1 | 10/2019 | Morikawa et al. |
| 2021/0095203 | A1 | 4/2021 | Aoyagi et al. |

FOREIGN PATENT DOCUMENTS

| | | |
|---|---|---|
| CN | 107446575 A | 12/2017 |
| JP | 2013-173868 A | 9/2013 |
| JP | 2017-002278 A | 1/2017 |
| JP | 2017-036430 A | 2/2017 |
| JP | 2017-110206 A | 6/2017 |
| JP | 2018-002870 A | 1/2018 |
| JP | 6572373 B1 | 9/2019 |
| JP | 2019-199531 A | 11/2019 |
| TW | I518169 B | 1/2016 |
| WO | 2011/058919 A1 | 5/2011 |
| WO | 2012/011444 A1 | 1/2012 |
| WO | 2014/030637 A1 | 2/2014 |

OTHER PUBLICATIONS

Oct. 20, 2020 International Search Report issued in International Patent Application No. PCT/JP2020/030893.
Sep. 3, 2024 Office Action issued in Korean Patent Application No. 10-2022-7007195.
Feb. 13, 2023 Office Action and Search Report issued in Chinese Patent Application No. 202080058026.5.

* cited by examiner

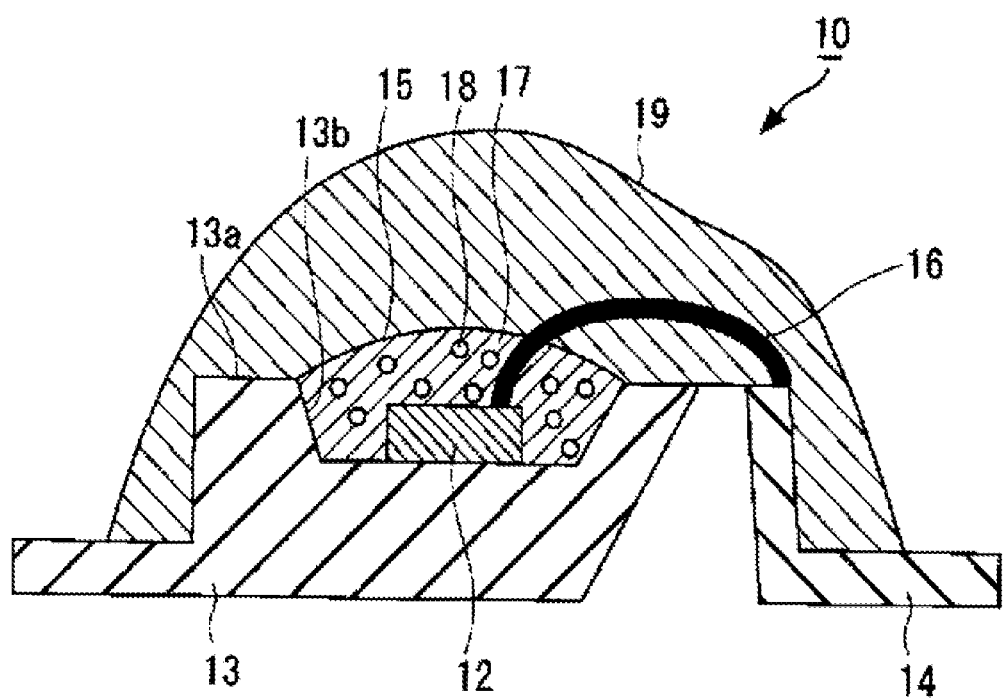

BETA-SIALON PHOSPHOR AND LIGHT EMITTING DEVICE

TECHNICAL FIELD

The present invention relates to a β-sialon phosphor and a light emitting device.

BACKGROUND ART

There is known a light emitting device that combines a light emitting element that emits primary light and a phosphor that absorbs primary light and emits secondary light.

In recent years, as the output of light emitting devices has increased, the demand for heat resistance and durability of phosphors has increased. Therefore, β-sialon phosphors having a stable crystal structure are attracting attention.

A phosphor $Eu^{2+}$ doped in the crystal structure of β-sialon is a phosphor which is excited by ultraviolet to blue light and emits green light having wavelengths of 520 nm or more and 550 nm or less. The $Eu^{2+}$ doped β-sialon is also called the Eu-doped β-sialon. This phosphor is used as a green light emitting component of a light emitting device such as a white light emitting diode (white LED (light emitting diode)). The Eu-doped β-sialon has a very sharp emission spectrum among phosphors in which $Eu^{2+}$ is doped. Therefore, the Eu-doped β-sialon is a phosphor particularly suitable for a green light emitting component of a backlight source of a liquid crystal display panel requiring narrow-band emission composed of three primary colors of blue, green, and red light.

Examples of the technique related to β-sialon phosphors include those described in Patent Document 1.

Patent Document 1 discloses a Eu-doped β-sialon represented by general formula: $Si_{6-Z}Al_ZO_ZN_{8-Z}$ ($0<Z\le0.42$), in which a 50% area average diameter of primary particles of the β-sialon is 5 μm or more.

RELATED DOCUMENT

Patent Document

[Patent Document 1] International Publication No. WO 2012/011444

SUMMARY OF THE INVENTION

Technical Problem

In recent years, further improvement in luminance has been required for β-sialon phosphors and light emitting devices.

The present invention has been made in view of such circumstances. The present invention provides a β-sialon phosphor and a light emitting device having improved luminance.

Solution to Problem

The present inventors have conducted various studies to improve luminance. In addition, as a result of studies, inventions to be provided below were completed.

According to the present invention,

A europium-doped β-sialon phosphor, in which, when a ratio of an aluminum element at a depth of 8 nm from a surface of the phosphor, which is obtained by X-ray photoelectron spectroscopy, is indicated by $P(Al)_8$ [at %], and a ratio of an aluminum element at a depth of 80 nm from the surface of the phosphor is indicated by $P(Al)_{80}$ [at %], $P(Al)_8/P(Al)_{80}\le0.9$ is satisfied is provided.

In addition, according to the present invention, a light emitting device including a light emitting light source and a wavelength conversion member, in which the wavelength conversion member contains a phosphor, and the phosphor contains the β-sialon phosphor.

is provided.

Advantageous Effects of Invention

According to the present invention, a β-sialon phosphor and a light emitting device having improved luminance are provided.

BRIEF DESCRIPTION OF THE DRAWINGS

FIG. 1 is a cross-sectional view schematically showing an example of a structure of a device.

DESCRIPTION OF EMBODIMENTS

Hereinafter, an embodiment of the present invention will be described in detail while referring to drawings.

In all of the drawings, the same configuration elements will be given the same reference sign and will not be repeated.

All of the drawings are simply intended for description. The shapes, dimensional ratios, or the like of individual members in the drawings do not necessarily correspond to actual articles.

In the present specification, unless particularly otherwise described explicitly, the term "substantially" indicates that production tolerances, assembly variations, and the like are included in ranges.

<β-Sialon Phosphor>

A β-sialon phosphor of the present embodiment is a europium-doped β-sialon phosphor.

When the ratio of an aluminum element at a depth of 8 nm from the surface of the phosphor, which is obtained by X-ray photoelectron spectroscopy, is indicated by $P(Al)_8$ [at %], and the ratio of an aluminum element at a depth of 80 nm from the surface of the phosphor is indicated by $P(Al)_{80}$ [at %], $P(Al)_8/P(Al)_{80}\le0.9$ is satisfied.

The β-sialon phosphor of the present embodiment is, for example, a phosphor made of $Eu^{2+}$-doped β-sialon that is represented by general formula $Si_{6-Z}Al_ZO_ZN_{8-Z}:Eu^{2+}$ ($0<Z\le4.2$). Hereinafter, the europium-doped β-sialon is also simply referred to as β-sialon.

In the general formula $Si_{6-Z}Al_ZO_ZN_{8-Z}:Eu^{2+}$, the Z value and the content of europium are not particularly limited. The Z value is, for example, more than 0 and 4.2 or less and preferably 0.005 or more and 1.0 or less from the viewpoint of further improving the light emitting intensity of the β-sialon phosphor. Further, the content of europium is preferably 0.1% by mass or more and 2.0% by mass or less.

The β-sialon phosphor is usually a plurality of particles firmly integrated during a heat treatment in a firing step. Each particle of a plurality of particles is called a primary particle, and a particle in which a plurality of particles are firmly integrated is called a secondary particle.

In the β-sialon phosphor of the present embodiment, $P(Al)_8/P(Al)_{80}\le0.9$ is satisfied, whereby the luminance improves. The reason therefor is not clear. However, when an Al-containing compound is present on the surfaces of the phosphor particles, the luminance may decrease, and the present inventors assume that, when the amount of an Al-containing compound on the surface portions of the phosphor particles as in the present embodiment, the luminance improves.

In obtaining the β-sialon phosphor of the present embodiment, it is preferable to select an appropriate production method in addition to selecting appropriate raw materials. For example, a β-sialon phosphor in which $P(Al)_8/P(Al)_{80} \leq 0.9$ is satisfied can be obtained by performing two-stage firing of a first firing step and a second firing step, which will be described later, by passing β-sialon phosphor particles through an appropriate sieve after the second firing step to remove coarse particles, and/or by performing an acid treatment as a treatment after the firing.

Hereinafter, the β-sialon phosphor of the present embodiment will be more specifically described.

(Preferable Ranges of $P(Al)_8$, $P(Al)_{80}$, and $P(Al)_8/P(Al)_{80}$)

$P(Al)_8$ is preferably 0.8 [at %] or less, more preferably 0.75 [at %] or less, and still more preferably 0.7 [at %] or less. $P(Al)_8$ may be 0, but is usually 0.1 [at %] or more and preferably 0.3 [at %] or more from the viewpoint of realistic design/production.

$P(Al)_{80}$ is preferably 0.9 [at %] or more and 5 [at %] or less, more preferably 0.9 [at %] or more and 3 [at %] or less, and still more preferably 0.9 [at %] or more and 2 [at %] or less.

$P(Al)_8/P(Al)_{80}$ may be 0.9 or less. $P(Al)_8/P(Al)_{80}$ is preferably 0.2 or more and 0.9 or less, more preferably 0.3 or more and 0.8 or less, and still more preferably 0.4 or more and 0.8 or less.

The luminance can be further increased by appropriately adjusting these numerical values.

(Rate $P(Al)_0$ of Aluminum Element on Outermost Surface)

Further, when the ratio of an aluminum element on the outermost surface of the phosphor, which is obtained by X-ray photoelectron spectroscopy, is indicated by $P(Al)_0$ [at %], $P(Al)_0$ is preferably 0.1 [at %] or less. When the amount of an aluminum element on the outermost surface of the phosphor is extremely small, the luminance can be further increased.

(Abundance of Elements Other than Aluminum)

The β-sialon phosphor of the present embodiment is "sialon" and thus usually contains Si, O and N in addition to Al. In addition, the β-sialon phosphor of the present embodiment contains Eu. The general formula of the β-sialon phosphor of the present embodiment is as described above.

For confirmation, the preferable ratios of each element other than Al at a depth of 8 nm or 80 nm from the surface of the phosphor or on the outermost surface of the phosphor will be described. It is considered that, when these rates are within appropriate ranges, the luminance further improves.

These ratios can also be obtained by X-ray photoelectron spectroscopy.

Rate of Each Element at Depth of 8 nm from Surface of Phosphor

Si: Preferably 35 [at %] or more and 45 [at %] or less, more preferably 38 [at %] or more and 43 [at %] or less, and still more preferably 40 [at %] or more and 43 [at %] or less Eu: Preferably 0.05 [at %] or more and 0.5 [at %] or less and more preferably 0.1 [at %] or more and 0.4 [at %] or less N: Preferably 42.5 [at %] or more and 52.5 [at %] or less and more preferably 45 [at %] or more and 50 [at %] or less O: Preferably 5 [at %] or more and 15 [at %] or less, more preferably 7.5 [at %] or more and 12.5 [at %] or less, and still more preferably 8 [at %] or more and 10.5 [at %] or less Rate of Each Element at Depth of 80 nm from Surface of Phosphor Si: Preferably 40 [at %] or more and 50 [at %] or less, more preferably 43 [at %] or more and 49 [at %] or less, and still more preferably 45 [at %] or more and 49 [at %] or less Eu: Preferably 0.05 [at %] or more and 0.5 [at %] or less and more preferably 0.1 [at %] or more and 0.4 [at %] or less N: Preferably 42 [at %] or more and 50 [at %] or less and more preferably 42.5 [at %] or more and 47 [at %] or less O: Preferably 5 [at %] or more and 15 [at %] or less, more preferably 5 [at %] or more and 12.5 [at %] or less, and still more preferably 5 [at %] or more and 10 [at %] or less The present inventors additionally found that, when the ratio of a silicon atom at a depth of 8 nm from the surface of the phosphor is indicated by $P(Si)_8$ [at %], and the ratio of a silicon atom at a depth of 80 nm from the surface of the phosphor is indicated by $P(Si)_{80}$ [at %], the phosphor is preferably designed such that $P(Si)_8/P(Si)_{80} \leq 0.95$ is satisfied. In such a case, the luminance can be further increased.

The present inventors presume that the Al-containing compound present on the surfaces of the phosphor particles, which may cause a decrease in the luminance, is specifically a compound containing Al and Si. Therefore, it is considered that, when not only Al is relatively small, but Si is also relatively small on the surface portions of the phosphor particles, the luminance further improves.

The value of $P(Si)_8/P(Si)_{80}$ is preferably 0.5 to 0.95 and more preferably 0.7 to 0.95.

(Supplement Regarding X-Ray Photoelectron Spectroscopy)

X-ray photoelectron spectroscopy will be supplemented.

In measuring $P(Al)_8$, $P(Al)_{80}$, and $P(Al)_0$, it is usual to cut the β-sialon phosphor by 8 nm or 80 nm by ion etching or the like and then irradiate the β-sialon phosphor with X-rays. The ion etching can usually be performed with Ar ions.

Regarding the ion etching rate and the etching depth obtained by multiplying the rate by time, usually, $SiO_2$-equivalent values can be adopted.

As an X-ray source, Al-Kα rays can be used.

Regarding specific conditions for X-ray photoelectron spectroscopy or ion etching, examples to be described later need to be referenced.

(Regarding Particle Size)

When the particle size of the β-sialon phosphor particle of the present embodiment is appropriate, the luminance can be further increased.

Specifically, the 50% diameter $D_{V50}$ (volume-based median diameter) in the cumulative volume in particle size distribution of the β-sialon phosphor particle of the present embodiment is preferably 5 μm or more and more preferably 10 μm or more. In addition, the upper limit value of $D_{V50}$ is preferably 50 μm and more preferably 30 μm.

$D_{V50}$ can be obtained by the laser diffraction scattering method based on JIS R 1629: 1997. In the measurement of $D_{V50}$, it is preferable to perform a pretreatment such as a dispersion treatment with an ultrasonic homogenizer such the particles are aggregated as little as possible.

Regarding specific conditions of the pretreatment, details of a measuring device, and the like, examples to be described later need to be referenced.

The β-sialon phosphor particle of the present embodiment is excited in a wide wavelength range from ultraviolet rays to visible light and emits green light having a main wavelength in a range of 520 nm or more and 550 nm or less with high efficiency. Therefore, the β-sialon phosphor particle is excellent as a green light-emitting phosphor.

Further, the β-sialon phosphor particle of the present embodiment can be suitably used as a material for a phosphor layer in a light emitting element. The light emitting element can be applied to a light emitting device such as a backlight source of a display or a lighting device. While not particularly limited, the light emitting element includes an LED and a phosphor layer laminated on the light emitting surface side of the LED. As the LED, an ultraviolet LED or blue LED that emits light having a wavelength of 300 nm or more and 500 nm or less, particularly, a blue LED that emits light having a wavelength of 440 nm or more and 480 nm or less can be used. In particular, a β-sialon phosphor particle obtained by a production method to be described later is excited at a wide wavelength from ultraviolet to blue light and emits green light with high luminance and thus can be suitably used as a phosphor for a white LED in which blue or ultraviolet light is used as a light source.

(Method for Producing β-Sialon Phosphor)

As briefly described above, the β-sialon phosphor of the present embodiment is produced by selecting an appropriate production method in addition to selecting appropriate raw materials.

Specifically, the β-sialon phosphor of the present embodiment can be obtained by adopting production efforts such as performing a firing step by separately adding a europium compound, which is one of the raw materials of the β-sialon phosphor, twice or more, producing the β-sialon phosphor particle by adding a sufficiently large amount of the europium compound in the second firing step, performing an annealing step, and performing an acid treatment after the firing.

However, for the β-sialon phosphor of the present embodiment, various other specific production conditions can be adopted on the premise that the above-described production efforts are adopted.

Hereinafter, a method for producing a β-sialon phosphor will be more specifically described.

The method for producing a β-sialon phosphor of the present embodiment preferably includes two firing steps. That is, the method for producing a β-sialon phosphor of the present embodiment preferably includes (i) a first firing step of firing a first raw material powder containing a first europium compound to obtain a first fired powder containing a β-sialon particle.

(ii) a second firing step of firing the obtained first fired powder and a second raw material powder containing a second europium compound to obtain the β-sialon phosphor of the present embodiment.

Here, in the second firing step, the second europium compound is preferably added in a larger amount than the conventional standard. Specifically, in the second firing step, the second europium compound is preferably added so that the amount of Eu exceeds the amount of Eu that can be doped in β-sialon.

While not clear in detail, it is considered that, when the second europium compound is added so that the amount of Eu exceeds the amount of Eu that can be doped in β-sialon in the second firing step, the element distribution differs between the surface layer portion and the inside of the particle of a phosphor, and furthermore, it becomes easy to obtain a β-sialon phosphor in which $P(Al)_8/P(Al)_{80} \leq 0.9$ is satisfied.

The method for producing a β-sialon phosphor may further include a third firing step of further firing the second fired powder to obtain a third fired powder once or more. At that time, a europium compound may be further added.

Here, in the present embodiment, the "first firing step" means a first firing step in which a raw material powder containing a first europium compound is heat-treated, the "second firing step" means a second firing step in which a second europium compound is added and heat-treated, and the "third firing step" means a firing step performed after the second firing step.

Further, in the present embodiment, the "first europium compound" means the europium compound added in the first firing step, and the "second europium compound" means a europium compound added in the second firing step.

Further, in the present embodiment, the "first raw material powder" means a raw material powder used in the first firing step, and the "second raw material powder" is a raw material powder used in the second firing step. It is preferable that each raw material powder is mixed.

Further, in the present embodiment, the "first fired powder" means a product obtained in the first firing step, the "second fired powder" means a product obtained in the second firing step, and the "third fired powder" means a product obtained in the third firing step.

Further, in the present embodiment, the term "step" includes not only independent steps but also steps that cannot be clearly distinguished from other steps as long as the intended purpose of the step is achieved. The content of europium in the composition means, when a plurality of substances corresponding to europium are present in the composition, the total amount of the plurality of substances present in the composition unless particularly otherwise specified.

The first raw material powder preferably contains silicon nitride and aluminum nitride in addition to the first europium compound. The silicon nitride and aluminum compounds are materials for forming the skeleton of β-sialon, and the europium compound is a material for forming an emission center.

The first raw material powder may further contain β-sialon. β-sialon is a material serving as an aggregate or core material.

The form of each of the above components contained in the first raw material powder is not particularly limited. The form of each of the above components is preferably a powder form.

A europium compound that can be used is not particularly limited. Examples thereof include an oxide containing europium, a hydroxide containing europium, a nitride containing europium, an oxynitride containing europium, and a halide containing europium. These can be used alone or in combination of two or more. Among them, europium oxide, europium nitride and europium fluoride are preferably used alone, and europium oxide is more preferably used alone.

The europium compound is preferably added separately before firing in a plurality of firing steps. Specifically, the europium compound is added before the first firing step and the second firing step, respectively.

In each firing step, europium is divided into those that are doped in β-sialon, those that volatilize, and those that remain as a heterophase component. The heterophase component containing europium can be removed by an acid treatment or the like. However, in a case where a significantly large amount of insoluble components generated by the acid treatment are generated, a component that is not dissolved by the acid treatment may be generated and the luminance may decrease. Incidentally, a heterophase that does not absorb excess light may remain, and europium may be contained in this heterophase. When the europium compound is added before firing in a plurality of firing steps, a β-sialon phosphor raw material other than the europium compound may be added together with the europium compound.

In the method for producing a β-sialon phosphor, when the total of the first fired powder and the second europium compound is set to 100% by mass, the ratio of the second europium compound is preferably 1.0% by mass or more, more preferably 2.0% by mass or more, and still more preferably 3.0% by mass or more from the viewpoint of more effectively removing Eu that does not contribute to improvement in the luminance of the β-sialon phosphor and further improving the luminance of the obtained β-sialon phosphor. Further, from the viewpoint of reducing the amount of insoluble heterophase components generated by the acid treatment and further improving the luminance of the obtained β-sialon phosphor, the ratio of the second europium compound is preferably 18.0% by mass or less, more preferably 17.0% by mass or less, and still more preferably 15.0% by mass or less.

In the method for producing a β-sialon phosphor of the present embodiment, when the ratio of the second europium compound is within the above range, Eu that does not contribute to the luminance improvement of the β-sialon phosphor can be removed more effectively, and at the same time, it is possible to suppress the generation of insoluble heterophase components generated by the acid treatment. Therefore, the production step of removing the heterophase component or the like can be simplified, and as a result, the production time of the β-sialon phosphor can be shortened.

The total amount of europium contained in the first raw material powder and the second raw material powder is not particularly limited, but is preferably 3 times or more the amount of europium doped in the finally obtained β-sialon phosphor, and more preferably 4 times or more.

Further, the total amount of europium contained in the first raw material powder and the second raw material powder is preferably 18 times or less the amount of europium doped in the finally obtained β-sialon phosphor. As a result, the amount of insoluble heterophase components generated by the acid treatment can be reduced, and the luminance of the obtained β-sialon phosphor can be further improved.

The amount of europium contained in the first raw material powder is not particularly limited. However, this amount is preferably larger than the amount of europium doped in the finally obtained β-sialon phosphor.

Further, the amount of europium contained in the first raw material powder is preferably 3 times or less the amount of europium doped in the finally obtained β-sialon phosphor. As a result, the amount of insoluble heterophase components generated by the acid treatment can be reduced, and the luminance of the obtained β-sialon phosphor can be further improved.

In each firing step, the raw material powder containing the europium compound can be obtained by, for example, a method of dry mixing, a method of wet mixing in an inert solvent that does not substantially react with each component of the raw material, and then removing the solvent. The mixing device is not particularly limited, but for example, a V-type mixer, a locking mixer, a ball mill, a vibration mill, or the like can be used.

The firing temperature in each firing step is not particularly limited. The firing temperature is preferably 1800° C. or higher and 2100° C. or lower.

When the firing temperature is 1800° C. or higher, the grain growth of the β-sialon phosphor proceeds more effectively. In addition, the light absorption rate, the internal quantum efficiency, and the external quantum efficiency can be further improved.

When the firing temperature is 2100° C. or lower, the decomposition of the β-sialon phosphor can be further suppressed. In addition, the light absorption rate, the internal quantum efficiency, and the external quantum efficiency can be further improved.

Other conditions such as the heating time, the heating rate, the heating holding time, and the pressure in each firing step are not particularly limited, and may be appropriately adjusted according to the raw materials used or the like. Typically, the heating holding time is 3 hours or longer and 30 hours or shorter, and the pressure is 0.6 MPa or more and 10 MPa or less.

In each firing step, as a method for firing a mixture, for example, a method of loading the mixture into a container made of a material that does not react with the mixture during firing (for example, boron nitride) and heating the mixture in a nitrogen atmosphere can be used. By using such a method, a crystal growth reaction, a solid solution reaction, or the like can be advanced to obtain a β-sialon phosphor.

The first fired powder and the second fired powder are granular or lumpy sintered bodies. The granular or lumpy sintered body can be made into a β-sialon phosphor having a predetermined size by using treatments such as crushing, pulverization, classification, or the like alone or in combination.

Specific examples of the treatment method include a method of pulverizing the sintered body to a predetermined particle size using a general pulverizer such as a ball mill, a vibration mill, or a jet mill. However, excessive pulverization does not only generate fine particles that are likely to scatter light, but may also cause crystal defects on the particle surface. That is, excessive pulverization may cause a decrease in the luminous efficiency of β-sialon and thus needs to be avoided. That is, this treatment may be performed after the acid treatment or an alkaline treatment described later.

The method for producing a β-sialon phosphor may further include, after the second firing step, an annealing step of heating the second fired powder at a temperature lower than the firing temperature of the second firing step to obtain an annealed product.

The annealing step is preferably performed in an inert gas such as a rare gas and a nitrogen gas, a reducing gas such as a hydrogen gas, a carbon monoxide gas, a hydrocarbon gas, and an ammonia gas, or a mixed gas thereof, or in a non-oxidizing atmosphere other than pure nitrogen such as a vacuum. The annealing step is particularly preferably performed in a hydrogen gas atmosphere or an argon atmosphere.

The annealing step may be performed under atmospheric pressure or pressurization.

The heat treatment temperature in the annealing step is not particularly limited. The heat treatment temperature is preferably 1200° C. or higher and 1700° C. or lower and more preferably 1300° C. or higher and 1600° C. or lower.

By performing the annealing step, the luminous efficiency of the β-sialon phosphor can be further improved. Further, the rearrangement of the elements removes strains and defects, so that transparency can also be improved.

That is, a heterophase may be generated by the annealing step, but this can be removed by an acid treatment or the like described later.

Before the annealing step, the compound of the element constituting the β-sialon phosphor may be added and mixed.

The compound to be added is not particularly limited, and examples thereof include an oxide, a nitride, an oxynitride, a fluoride, and a chloride of each element.

In particular, by adding silica, aluminum oxide, europium oxide, europium fluoride, or the like to each heat-treated product, the luminance of the β-sialon phosphor can be further improved. However, it is desirable that the undissolved residue of the raw material to be added can be removed by acid treatment, alkaline treatment, or the like after the annealing step.

In the method for producing a β-sialon phosphor, it is preferable that the second fired powder or the annealed product of the second calcined powder is passed through a sieve having an appropriate mesh size to remove coarse particles. The present inventors found that this is because there is a possibility that coarse particles may contain a relatively large amount of the Al-containing compound that may decrease the luminance. The mesh size of the sieve is preferably about 75 μm/#200 or less.

In the method for producing a β-sialon phosphor, a step of performing an acid treatment, an alkaline treatment, and/or a fluorine treatment on the second fired powder or the annealed product of the second fired powder may be further performed.

The acid treatment or the alkaline treatment is a treatment in which, for example, an acidic or alkaline liquid is brought into contact with the second fired powder or the annealed product of the second fired powder. The fluorine treatment is, for example, a step of bringing a gas containing fluorine into contact with the second fired powder or the annealed product of the second fired powder.

It is considered that, by performing such a step, it is possible to dissolve and remove the heterophase component (luminescence inhibitor) generated in the firing step, the annealing step, and the like. Therefore, the light absorption rate, the internal quantum efficiency, and the external quantum efficiency of the β-sialon phosphor can be further improved.

As the acidic liquid, for example, an aqueous solution containing one or more acids selected from hydrofluoric acid, sulfuric acid, phosphoric acid, hydrochloric acid, and nitric acid can be used. As the alkaline liquid, for example, an aqueous solution containing one or more alkalis selected from potassium hydroxide, aqueous ammonia, and sodium hydroxide can be used, but an acidic aqueous solution is more preferable, and a mixed aqueous solution of hydrofluoric acid and nitric acid is particularly preferable.

The treatment method using the acidic or alkaline liquid is not particularly limited, and the treatment can be performed by dispersing the second fired powder or the annealed product of the second fired powder in the aqueous solution containing an acid or an alkali and stirring the second fired powder or the annealed product for about several minutes to several hours (for example, 10 minutes to 6 hours). After this treatment, it is desirable to separate substances other than the β-sialon phosphor by filtration and wash the substances adhering to the β-sialon phosphor with water.

<Light Emitting Device>

A light emitting device of the present embodiment is a light emitting device including a light emitting light source and a wavelength conversion member. The wavelength conversion member contains a phosphor. In addition, the phosphor includes the β-sialon phosphor of the present embodiment (the β-sialon phosphor described above).

FIG. 1 is a cross-sectional view schematically showing an example of a structure of a light emitting device 10.

The light emitting device 10 shown in FIG. 1 includes an LED chip as a light emitting light source 12, a first lead frame 13 on which the light emitting light source 12 is mounted, a second lead frame 14, a wavelength conversion member 15 that covers the light emitting light source 12, a bonding wire 16 that electrically connects the light emitting light source 12 and the second lead frame 14, and a cap 19 made of synthetic resin that covers these. The wavelength conversion member 15 has a phosphor 18 and a sealing resin 17 in which the phosphor 18 is dispersed.

On an upper portion 13a of the first lead frame 13, a recess portion 13b is formed for mounting a light emitting diode chip as the light emitting light source 12. The recess portion 13b has a substantially funnel shape in which the hole diameter gradually expands upward from the bottom surface thereof, and the inner surface of the recess portion 13b serves as a reflective surface. An electrode on the lower surface side of the light emitting light source 12 is die-bonded to a bottom surface of the reflective surface. Another electrode formed on an upper surface of the light emitting light source 12 is connected to a surface of the second lead frame 14 via the bonding wire 16.

Various LED chips can be used as the light emitting light source 12. Particularly preferred is an LED chip that generates light having a wavelength of blue light from near ultraviolet of 300 nm or more and 500 nm or less.

The phosphor 18 used for the wavelength conversion member 15 of the light emitting device 10 includes the β-sialon phosphor of the present embodiment. Further, from the viewpoint of controlling the light wavelength control of the light emitting device 10, the phosphor 18 may further contain a phosphor such as an α-sialon phosphor, a KSF-based phosphor, a single substance, or a mixture of $CaAlSiN_3$ or YAG in addition to the β-sialon phosphor the present embodiment. Examples of the element doped in these phosphors include europium (Eu), cerium (Ce), strontium (Sr), calcium (Ca), and manganese (Mn). These phosphors may be used alone or in combination of two or more.

Among these, the phosphor used in combination with the β-sialon phosphor of the present embodiment is preferably a manganese-doped KSF-based phosphor. By using the β-sialon phosphor of the present embodiment showing green color and the KSF-based phosphor showing red color in combination, it can be suitably used as a backlight LED suitable for a high color rendering TV, for example.

By combining the light emitting light source 12 and the wavelength conversion member 15, light having a high light emitting intensity can be emitted.

It is mentioned for confirmation that the manganese-doped KSF-based phosphor can be represented by general formula: $A_2M_{(1-n)}F_6:Mn^{4+}{}_n$. In this general formula, the element A is one or more alkali metal elements containing K, the element M is a combination with one or more element selected from the group consisting of Si single substance, Ge single substance, or Si and Ge, Sn, Ti, Zr and Hf, and $0 < n \leq 0.1$.

In the case of the light emitting device 10 using the β-sialon phosphor of the present embodiment, the light emitting light source 12 radiates particularly near-ultraviolet light or visible light containing a wavelength of 300 nm or more and 500 nm or less as an excitation source, the light emitting device 10 has green light emission characteristics having a peak at a wavelength in a range of 520 nm or more and 550 nm or less. Therefore, by using a near-ultraviolet LED chip or a blue LED chip as the light emitting light source 12 and the β-sialon phosphor of the present embodiment, and further combining a single substance or a mixture of a red light emitting phosphor, a blue light emitting phosphor, a yellow light emitting phosphor, or an orange light emitting phosphor having wavelengths of 600 nm or more and 700 nm or less, the light emitting device 10 is capable of emitting white light.

Since the light emitting device 10 contains a β-sialon phosphor having improved light emitting intensity, the luminance is favorable.

Hitherto, the embodiment of the present invention has been described, but the embodiment is an example of the present invention, and it is possible to adopt a variety of configurations other than the above-described configuration. Further, the present invention is not limited to the above-described embodiment, and modifications, improvements, and the like are included in the present invention as long as the object of the present invention can be achieved.

EXAMPLES

The embodiment of the present invention will be described in detail based on examples and comparative examples. It is mentioned for confirmation that the present invention is not limited only to examples.

Example 1

Using a V-type mixer (S-3 manufactured by Tsutsui Scientific Instruments Co., Ltd.), 95.80% by mass of an α-silicon nitride powder (SN-E10 grade, oxygen content 1.0% by mass) manufactured by Ube Industries, Ltd., 2.74% by mass of an aluminum nitride powder (F grade, oxygen content 0.8% by mass) manufactured by Tokuyama Corporation, 0.56% by mass of aluminum oxide powder (TM-DAR grade) manufactured by TAIMEI CHEMICALS Co., Ltd., and 0.90% by mass of a europium oxide powder (RU grade) manufactured by Shin-Etsu Chemical Co., Ltd. were mixed, and then the obtained mixture was passed through a sieve having a mesh size of 250 μm to remove aggregates, thereby obtaining a first raw material mixed powder. The compounding ratio (referred to as first compounding composition (% by mass)) here was designed such that, in general formula of β-sialon: $Si_{6-Z}Al_ZO_ZN_{8-Z}$, Z was calculated from the Si/Al ratio with europium oxide excluded and became 0.22.

A cylindrical boron nitride container with a lid and having an inner diameter of 10 cm and a height of 10 cm was filled with 200 g of the obtained raw material powder having the first compounding composition, and a heat treatment (first firing step) was performed at 1950° C. for 10 hours in a pressurized nitrogen atmosphere of 0.8 MPa in an electric furnace having a carbon heater. The powder subjected to the heat treatment was pulverized by a supersonic jet crusher (PJM-80SP, manufactured by Nippon Pneumatic Mfg. Co., Ltd.), and then the obtained pulverized product was passed through a nylon sieve having a mesh size of 45 μm to obtain a first fired powder.

The obtained first fired powder and a europium oxide powder (RU grade) manufactured by Shin-Etsu Chemical Co., Ltd. were compounded at a compounding ratio of 90:10 (referred to as the second compounding composition (% by mass)), and the first fired powder and the europium oxide powder were mixed using a V-type mixer (S-3 manufactured by Tsutsui Scientific Instruments Co., Ltd.). Subsequently, the obtained mixture was passed through a nylon sieve having a mesh size of 250 μm to remove aggregates, thereby obtaining a second raw material mixed powder.

A cylindrical boron nitride container with a lid and having an inner diameter of 10 cm and a height of 10 cm was filled with 200 g of the obtained raw material powder having the second compounding composition, and a heat treatment (second firing step) was performed at 2020° C. for 12 hours in a pressurized nitrogen atmosphere of 0.8 MPa in an electric furnace having a carbon heater. The powder subjected to the heat treatment was pulverized by a supersonic jet crusher (PJM-80SP, manufactured by Nippon Pneumatic Mfg. Co., Ltd.), and then the obtained pulverized product was passed through a nylon sieve having a mesh size of 45 μm to obtain a second fired powder. The passing rate of the sieve was 92%.

A cylindrical boron nitride container with a lid and having an inner diameter of 5 cm and a height of 3.5 cm was filled with 20 g of the second fired powder, and an annealing treatment was performed at 1500° C. for 8 hours in an atmospheric pressure argon atmosphere in an electric furnace having a carbon heater. The powder subjected to the annealing treatment was subjected to acid treatment by immersing it in a 1:1 mixed acid of 50% hydrofluoric acid and 70% nitric acid at 75° C. for 30 minutes. The powder after the acid treatment was precipitated as it was, decantation for removing the supernatant liquid and fine powder was repeated until the pH of the solution was 5 or more and the supernatant liquid became transparent, and the finally obtained precipitate was filtered and dried to obtain a phosphor powder of Example 1.

As a result of powder X-ray diffraction measurement, it was found that the crystal phase present was a β-sialon single phase and a β-sialon phosphor was obtained. The Eu content measured by ICP emission spectroscopic analysis was 0.72% by mass.

The first compounding composition and the second compounding composition in Example 1 are shown in Table 1 shown below.

<Rates of Aluminum Element and the Like Obtained by X-Ray Photoelectron Spectroscopy>

First, the β-sialon phosphor was cut by 8 nm or 80 nm in terms of the $SiO_2$-equivalent value by ion etching for which Ar ions were used.

The β-sialon phosphor cut by 8 nm or 80 nm was analyzed by XPS with the following device under the following conditions, thereby obtaining information regarding an element ratio at each depth.

Device: X-tool manufactured by ULVAC-PHI Inc Analysis conditions: Al-Kα ray, 15 kV, and 50 W Analysis area: 200 μmφ

In addition, on the β-sialon phosphor that was not ion-etched using Ar ions, the XPS analysis was also performed in the same manner. As a result, information regarding the elemental composition of the outermost surface was also obtained.

The information of the element ratios is shown in Table 2.

<Measurement of $D_{V50}$>

The particle size distribution of the β-sialon phosphor particles of Example 1 was measured by a laser diffraction scattering method based on JIS R 1629: 1997 using Microtrac MT3300EX II (MicrotracBEL Corp.). A pretreatment of a measurement sample was performed as follows.

0.5 g Of β-sialon phosphor particles were injected into 100 cc of ion-exchanged water, and a dispersion treatment was performed thereon for 3 minutes with Ultrasonic Homogenizer US-150E (Nissei Corporation, chip size φ20 mm, Amplitude 100%, oscillation frequency 19.5 KHz, amplitude about 31 μm). This was used as a sample for measurement.

The particle size distribution of the sample for measurement was measured using the above device. $D_{V50}$ was obtained from the obtained particle size distribution. $D_{V50}$ is shown in Table 1 shown below.

<Evaluation of Fluorescence Characteristics>

The fluorescence characteristics of the β-sialon phosphor were evaluated by the peak intensity and peak wavelength measured by the following methods.

As a device, a spectrofluorometer (F-7000, manufactured by Hitachi High-Technologies Corporation) calibrated by the Rhodamine B method and a standard light source was used. A dedicated solid sample holder was filled with the obtained phosphor powder, then, the fluorescence spectrum when irradiated with excitation light dispersed at a wavelength of 455 nm was measured using a spectrofluorometer, and the peak intensity and peak wavelength were obtained from the obtained fluorescence spectrum. The obtained results are shown in Table 3.

shown in Table 1. As a result of powder X-ray diffraction measurement of the obtained β-sialon phosphor, the crystal phase present in both was a β-sialon single phase.

Further, the same evaluation as in Example 1 was performed. The obtained results are shown in Table 2 and Table 3.

Comparative Example 1

A β-sialon phosphor powder was obtained in the same manner as in Example 1 except that the step corresponding to the second firing step of Example 1 was not carried out. As a result of powder X-ray diffraction measurement of the obtained β-sialon phosphor, the crystal phase present was a β-sialon single phase.

Further, the same evaluation as in Example 1 was performed. The obtained results are shown in Table 2 and Table 3.

TABLE 1

| | First compounding composition (% by mass) | | | | | Second compounding composition (% by mass) | | | | Composition | |
|---|---|---|---|---|---|---|---|---|---|---|---|
| | $Si_3N_4$ | AlN | $Al_2O_3$ | First $Eu_2O_3$ | First fired powder | $Si_3N_4$ | AlN | $Al_2O_3$ | Second $Eu_2O_3$ | (% by mass) Eu | $D_{v50}$ (μm) |
| Example 1 | 95.80 | 2.74 | 0.56 | 0.90 | 90.00 | — | — | — | 10.00 | 0.72 | 19.1 |
| Example 2 | 95.80 | 2.74 | 0.56 | 0.90 | 95.00 | — | — | — | 5.00 | 0.67 | 19.2 |
| Comparative Example 1 | 95.80 | 2.74 | 0.56 | 0.90 | | | | | | 0.78 | 18.0 |

TABLE 2

| | | Si [at %] | Al [at %] | Eu [at %] | N [at %] | O [at %] | $P(Al)_8/P(Al)_{80}$ | $P(Si)_8/P(Si)_{80}$ |
|---|---|---|---|---|---|---|---|---|
| Example 1 | Depth of 8 nm | 41.6 | 0.7 | 0.3 | 47.6 | 9.8 | 0.64 | 0.90 |
| | Depth of 80 nm | 46.1 | 1.1 | 0.3 | 44.3 | 8.2 | | |
| Example 2 | Depth of 8 nm | 41.6 | 0.5 | 0.2 | 47.9 | 9.8 | 0.50 | 0.88 |
| | Depth of 80 nm | 47.1 | 1.0 | 0.3 | 45.1 | 6.5 | | |
| Comparative Example 1 | Depth of 8 nm | 45.7 | 1.0 | 0.2 | 47.1 | 6.0 | 1.0 | 1.0 |
| | Depth of 80 nm | 45.8 | 1.0 | 0.3 | 45.9 | 7.0 | | |

It is mentioned for confirmation that, since the peak intensity varies depending on the measuring device and conditions, the unit is an arbitrary unit, the peak intensity was measured under the same condition in each of the examples and the comparative examples, and the β-sialon phosphor of each of the examples and the comparative examples was continuously measured and compared. Table 3 shows the peak intensities of the phosphors when the peak intensity of the β-sialon phosphor of Comparative Example 1 is set to 100%.

<Cie Chromaticity>

The CIE (Commission Internationale de l'Eclairage) chromaticity of the fluorescence spectrum was obtained by measuring the emission spectrum of the total light flux obtained by collecting the fluorescence for excitation at 455 nm by using an integrating sphere in an instantaneous multi-photometry system (MCPD-7000, manufactured by Otsuka Electronics Co., Ltd.).

Example 2

β-sialon phosphor powders were obtained by the same method as in Example 1 except that the second compounding composition was changed to the compounding ratio In Examples 1 and 2, the value of $P(Al)_0$ was less than 0.1 [at %], which was the detection limit of the device.

TABLE 3

| | Example 1 | Example 2 | Comparative Example 1 |
|---|---|---|---|
| Emission peak intensity (%) | 113 | 110 | 100 |
| Emission peak wavelength (nm) | 543 | 544 | 543 |
| Chromaticity x | 0.367 | 0.368 | 0.362 |
| Chromaticity y | 0.616 | 0.615 | 0.619 |

As shown in Table 3 and the like, the emission peak intensities of the β-sialon phosphors of Examples 1 and 2 in which $P(Al)_8/P(Al)_{80} \leq 0.9$ was satisfied were larger than the emission peak intensity of the β-sialon phosphor of Comparative Example 1 in which $P(Al)_8/P(Al)_{80}=1$ by 10% or more. That is, it was shown that luminance can be improved by the β-sialon phosphor in which $P(Al)_8/P(Al)_{80} \leq 0.9$ is satisfied.

This application claims priority on the basis of Japanese Patent Application No. 2019-150289 filed on Aug. 20, 2019, the entire disclosure of which is incorporated herein by reference.

REFERENCE SIGNS LIST 10 light emitting device
12 light emitting light source (LED chip)
13 first lead frame
13a upper portion
13b recess portion
14 second lead frame
15 wavelength conversion member
16 bonding wire
17 sealing resin
18 phosphor (β-sialon phosphor)
19 cap

The invention claimed is:

1. A europium-doped β-sialon phosphor,
wherein an atomic percentage of an aluminum element to all elements at a depth of 8 nm from a surface of the phosphor, which is obtained by X-ray photoelectron spectroscopy, is indicated by $P(Al)_8$, an atomic percentage of an aluminum element to all elements at a depth of 80 nm from the surface of the phosphor is indicated by $P(Al)_{80}$, and wherein $P(Al)_8/P(Al)_{80}$ is ≤0.8,
the $P(Al)_8$ is from 0.3 or more to 0.8 or less, and
the β-sialon phosphor is represented by general formula $Si_{6-Z}Al_ZO_ZN_{8-Z}:Eu^{2+}$ (0<Z≤4.2).

2. The β-sialon phosphor according to claim 1,
wherein the $P(Al)_{80}$ is from 0.9 or more to 5 or less.

3. The β-sialon phosphor according to claim 1,
wherein an atomic percentage of an aluminum element to all elements on an outermost surface of the phosphor, which is obtained by X-ray photoelectron spectroscopy, is indicated by $P(Al)_0$, and wherein $P(Al)_0$ is 0.1 or less.

4. The β-sialon phosphor according to claim 1,
wherein a 50% diameter $D_{V50}$ in a cumulative volume in particle size distribution is 5 μm or more and 50 μm or less.

5. The β-sialon phosphor according to claim 1,
wherein an atomic percentage of a silicon element to all elements at a depth of 8 nm from the surface of the phosphor, which is obtained by X-ray photoelectron spectroscopy, is indicated by $P(Si)_8$, an atomic percentage of a silicon element to all elements at a depth of 80 nm from the surface of the phosphor is indicated by $P(Si)_{80}$, and wherein $P(Si)_8/P(Si)_{80}$ is ≤0.95.

6. A light emitting device comprising:
a light emitting light source; and
a wavelength conversion member,
wherein the wavelength conversion member contains a phosphor, and
the phosphor contains the β-sialon phosphor according to claim 1.

7. The light emitting device according to claim 6,
wherein the light emitting light source includes an LED chip that generates light having a wavelength of 300 nm to 500 nm.

8. The light emitting device according to claim 6,
wherein the phosphor further contains a manganese-doped KSF-based phosphor.

* * * * *